United States Patent
Na et al.

(10) Patent No.: US 7,389,576 B2
(45) Date of Patent: Jun. 24, 2008

(54) METHOD OF MANUFACTURING MICRO FLUX GATE SENSOR

(75) Inventors: Kyoung-won Na, Seoul (KR); Jingli Yuan, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 97 days.

(21) Appl. No.: 11/403,904

(22) Filed: Apr. 14, 2006

(65) Prior Publication Data

US 2007/0094861 A1    May 3, 2007

(30) Foreign Application Priority Data

Nov. 3, 2005    (KR)    ...................... 10-2005-0105056

(51) Int. Cl.
*G01R 3/00* (2006.01)
(52) U.S. Cl. ........................... 29/595; 29/602.1; 29/605; 29/606; 205/119; 205/122; 216/22; 216/39; 216/41; 216/48; 310/179; 310/208; 336/176; 336/200; 336/229
(58) Field of Classification Search ................ 29/592.1, 29/595, 602.1, 605, 606; 216/22, 39, 41, 216/48; 204/119, 122; 310/179, 208; 336/176, 336/200, 229
See application file for complete search history.

(56) References Cited

U.S. PATENT DOCUMENTS

| | | | | |
|---|---|---|---|---|
| 6,411,086 | B1* | 6/2002 | Choi et al. | 324/253 |
| 7,208,947 | B2* | 4/2007 | Park et al. | 324/253 |
| 2005/0024050 | A1* | 2/2005 | Na et al. | 324/253 |
| 2005/0172480 | A1* | 8/2005 | Choi et al. | 29/607 |

FOREIGN PATENT DOCUMENTS

JP    2004361408 A  *  12/2004

* cited by examiner

*Primary Examiner*—Paul D Kim
(74) *Attorney, Agent, or Firm*—Sughrue Mion, PLLC (57) ABSTRACT

A method of manufacturing a micro flux gate sensor that has a good electrical connection and can be easily manufactured includes operations of forming a metal pattern, forming a first insulation layer to cover the metal pattern and forming viaholes to expose a certain portion of the metal pattern, applying an electrical signal through the metal pattern and plating the viaholes with a metal material to form a connection portion, forming a magnetic core on an upper portion of the first insulation layer, forming a second insulation layer to cover the magnetic core and forming an upper coil portion electrically connected to the connection portion to form the excitation coil and the magnetic field detecting coil, forming a third insulation layer to cover the upper coil portion, and removing a certain portion of the metal pattern to leave only the lower coil portion of the metal pattern.

9 Claims, 9 Drawing Sheets

METHOD OF MANUFACTURING MICRO FLUX GATE SENSOR

CROSS-REFERENCE TO RELATED APPLICATIONS

This application claims the benefit of Korean Patent Application No. 10-2005-105056 filed on Nov. 3, 2005, in the Korean Intellectual Property Office, the disclosure of which is incorporated herein by reference in its entirety.

BACKGROUND OF THE INVENTION

1. Field of the Invention

The present invention relates to a method of manufacturing a micro flux gate sensor.

2. Description of the Related Art

A fluxgate sensor is a device that detects magnetic energy, which is not perceivable by human sense organs. Such a magnetic detection sensor may be used in applications that require detection of magnetic energy formed around a circumference. For example, these applications may include position identification of airplanes, vessels and vehicles, motion detection in a virtual reality space, geomagnetic compensation and dot noise compensation for high definition television (HDTV), magneto-encephalograph and magneto-cardiograph measurement acquisition in a medical device, and many others.

Recently, since the fields of application have gradually spread, there has been a trend toward providing devices that are thinner, lighter and less expensive. Correspondingly, there has been a trend toward providing a fluxgate sensor that is thinner, lighter and less expensive.

A micro fluxgate sensor primarily includes a core made of soft magnetic material, an excitation coil wound around the core for inducing a magnetic field when a current is applied thereto, and a magnetic field detecting coil for detecting the effect of an external magnetic field on the magnetic field induced by the excitation coil. A basic detecting principle utilizes a nonlinear characteristic of the soft magnetic core, i.e., a saturation characteristic. If a proper alternating current (AC) is applied to the excitation coil to induce the magnetic field, flux density in the core is periodically saturated. At that time, if the external magnetic field to be measured is applied, the flux density of the core varies. The magnetic field detecting coil measures a variation of the flux to determine a dimension, either strength or direction, of the external magnetic field.

In order to manufacture a micro fluxgate sensor, a coil is generally wound around a large, bar-type core or a ring-type core of a soft magnetic ribbon. Accordingly, the core itself becomes relatively large thereby enlarging its volume and increasing the manufacturing cost of the core. In addition, since the flux variation generated by the excitation coil and the detected magnetic field do not prevent flux leakage due to the core, highly sensitive detection of the magnetic field is not readily achieved.

Therefore, various methods of manufacturing a flux gate sensor by using a MEMS technique have been studied and developed.

For example, a first seed layer is formed on a wafer and a metal material is plated according to a certain pattern on the first seed layer to form a lower coil. A first insulation layer is formed on the lower coil and a core layer of magnetic material is formed at a position corresponding to the lower coil, on the first insulation layer. Then, a second insulation layer is formed to cover the core layer, and the first and the second insulation layers are etched to form a viahole so as to expose the lower coil.

Then, a second seed layer is formed on the viahole and the second insulation layer and a metal material is plated according to a certain pattern on the second seed layer to form an upper coil. Since the viahole is filled with the metal material, the upper coil and the lower coil are electrically connected. A third insulation layer is formed to cover the upper coil. According to this process, a flux gate sensor is manufactured.

However, according to the conventional method of manufacturing the flux gate sensor, it is impossible to measure whether the viahole is formed to open to the lower coil because the size of the viahole is too small. Accordingly, the lower coil and the upper coil may not be electrically connected although the seed layer is formed on the viahole and the viahole is filled with the metal material.

If the viahole is formed too large in view of the above disadvantage, the metal material filling neighboring viaholes comes into contact with each other to generate defects.

SUMMARY OF THE INVENTION

The present invention has been conceived to solve the above-mentioned problems occurring in the prior art, and an aspect of the present invention is to provide a method of manufacturing a micro flux gate sensor that has a good electrical connection and can be easily manufactured.

In order to achieve the above aspects, there is provided a method of manufacturing a micro flux gate sensor including: (a) forming a metal pattern including a lower coil portion of an excitation coil and a magnetic field detecting coil on a wafer, (b) forming a first insulation layer to cover the metal pattern and forming viaholes to expose a certain portion of the metal pattern, (c) applying an electrical signal through the metal pattern and plating the viaholes with a metal material to form a connection portion, (d) forming a magnetic core on an upper portion of the first insulation layer, (e) forming a second insulation layer to cover the magnetic core and forming an upper coil portion electrically connected to the connection portion to form the excitation coil and the magnetic field detecting coil, (f) forming a third insulation layer to cover the upper coil portion, and (g) removing a certain portion of the metal pattern to leave only the lower coil portion of the metal pattern.

The operation of (a) may include operations of cleaning the wafer and forming a seed layer, forming first photo-resist membrane patterns on an upper portion of the seed layer, electroplating portions between the first photo-resist membrane patterns with a metal material, and removing the first photo-resist membrane patterns to leave only the metal material.

The metal pattern may include the lower coil portions arranged in two rows, extension metal lines extended from first ends of the lower coil portions, and common metal lines connected to first ends of each of the extension metal lines. The electrical signal can be applied to each of the lower coil portions through the common metal lines.

The operation of (b) may include operations of etching portions of the seed layer, from which are removed the first photo-resist membrane patterns, forming the first insulation layer on the metal pattern and the portions from which the seed layer has been removed, and forming the viaholes to penetrate the first insulation layer and reach each of opposite ends of the lower coil portions.

The operation of (e) may include operations of forming a second insulation layer to cover the magnetic core and the connection portion, patterning the second insulation layer to expose the connection portion, forming a second seed layer including the exposed connection portion, on the second insulation layer, forming second photo-resist membrane patterns on the second seed layer, and electroplating portions between the second photo-resist membrane patterns with the metal material to form the upper coil portion.

The operation of (f) may include operations of removing the second photo-resist membrane patterns, removing the second seed layer portions exposed by removal of the second photo-resist membrane patterns, and depositing a third insulation layer to cover the upper coil portion.

In the operation of (g), portions of the metal material except for portions corresponding to the lower coil portions and the upper coil portions may be etched according to a mask pattern to leave only the lower coil of the metal pattern.

In the operation of (g), the extension metal lines may be etched and removed so that the common metal line is isolated from the lower coil portions.

In the operation of (g), the extension metal lines and the common metal line may be both etched and removed.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

Figure 1:
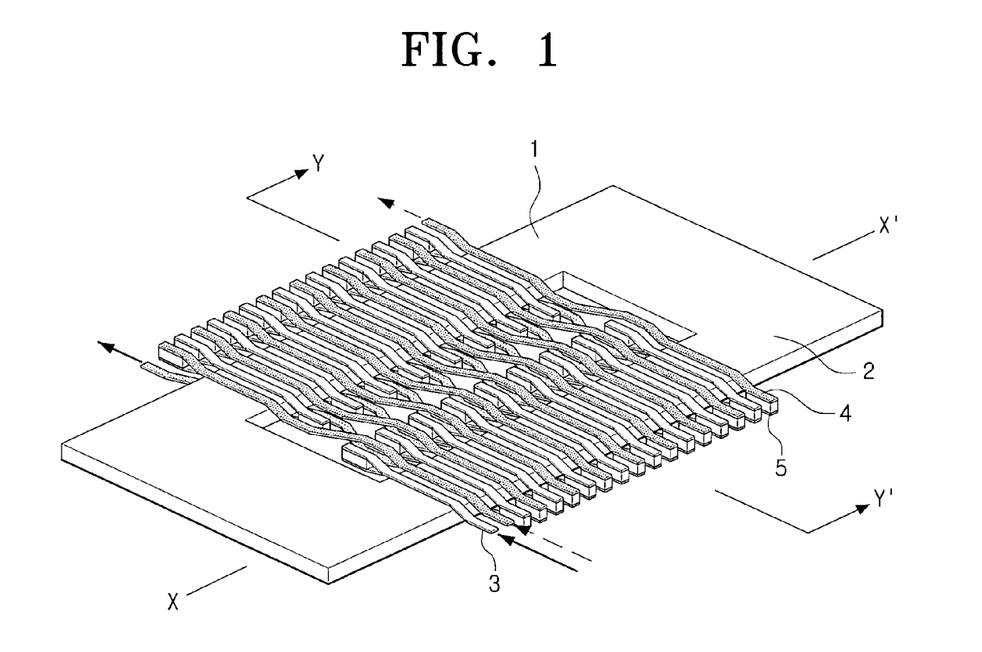
FIG. 1 is a view illustrating a micro flux gate sensor manufactured according to an embodiment of the present invention.

FIG. 1 illustrates a basic structure of a micro flux gate sensor manufactured according to an embodiment of the present invention. Referring to FIG. 1, the micro fluxgate sensor includes two bar-type magnetic cores 1 and 2, an excitation coil 3 wound around the magnetic cores 1 and 2, and a magnetic field detecting coil 4 wound around the excitation coil 3 and the two magnetic cores 1 and 2.

The respective coils 3 and 4 include a lower coil portion and an upper coil portion formed on a wafer, and the respective lower coil portions and the respective upper coil portions are joined by a connection portion 5 to form a coil. The coil portions, i.e., the excitation coil 3 and the magnetic field detecting coil 4 may be divided into an excitation coil and a detecting coil according to manufacturer design.

Hereafter, the coil portion is collectively manufactured and connections between coils are varied to divide the coil portion into an excitation coil and a magnetic field detecting coil. For example, even-numbered coils may be used as excitation coils, and odd-numbered coils may be used as magnetic field detecting coils, or vice versa. To this end, during the connection of coil portions, coil portions to be used for the excitation coils are connected each other and coil portions to be used for the magnetic field detecting coils are connected to each other, and the coil portions are connected through each pad to external terminals.

One of the two bar-type cores 1 and 2 will be called a first core 1, and the other will be called a second core 2. According to an embodiment of the present invention, the lower coil of the first core 1 is connected to the upper coil of the second core 2, and the lower coil of the second core 2 is connected to the upper coil of the first core 1. This process is repeated. Accordingly, the excitation coil may be provided in figure '8' form with respect to the two bar-type cores.

Hereafter, the method of manufacturing a micro flux gate sensor according to an embodiment of the present invention will be explained by describing each process with reference to accompanying drawings.

Figure 2A:
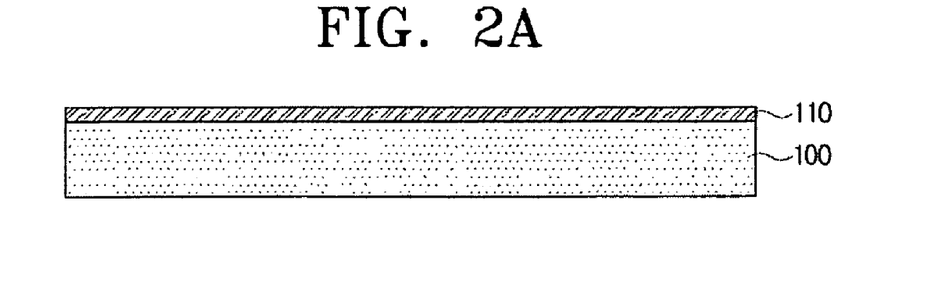
FIGS. 2A through 2L are cross-sectional views of a micro flux gate sensor taken on line Y-Y' of FIG. 1 to explain a process of manufacturing a micro flux gate sensor according to an embodiment of the present invention.
Figure 3A:
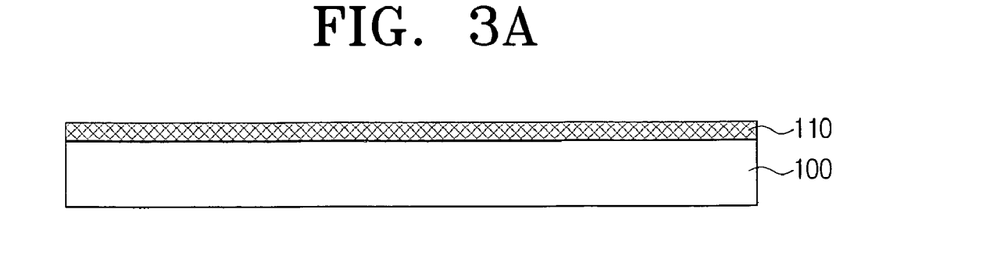
FIGS. 3A through 3J are cross-sectional views of a micro flux gate sensor taken on line X-X' of FIG. 1 to explain a process of manufacturing a micro flux gate sensor according to an embodiment of the present invention.

As shown in FIGS. 2A and 3A, a general wafer 100 is cleaned and a seed layer 110 is formed. The first seed layer 110 is for electroplating lower metal patterns 130. The electroplating operation will be explained later.

Figure 2B:
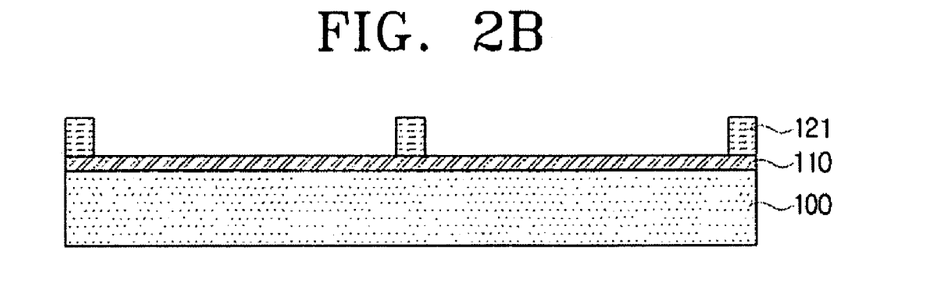
Figure 3B:
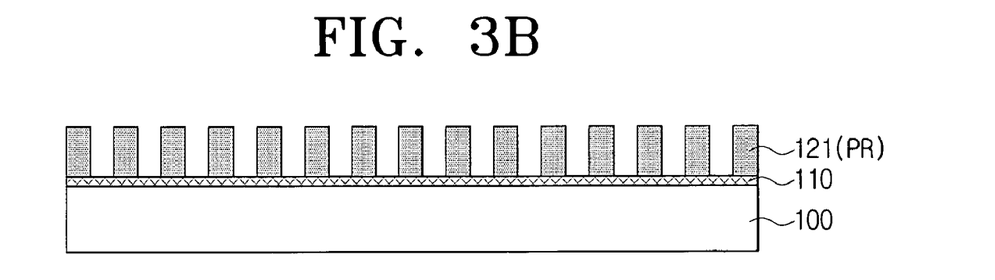

As shown in FIG. 2B and 3B, first photo-resist membrane patterns 121 are formed on the first seed layer 110. The first photo-resist membrane patterns 121 serve as a mold to form the lower metal patterns 130. The forming operation will be explained later.

Figure 2C:
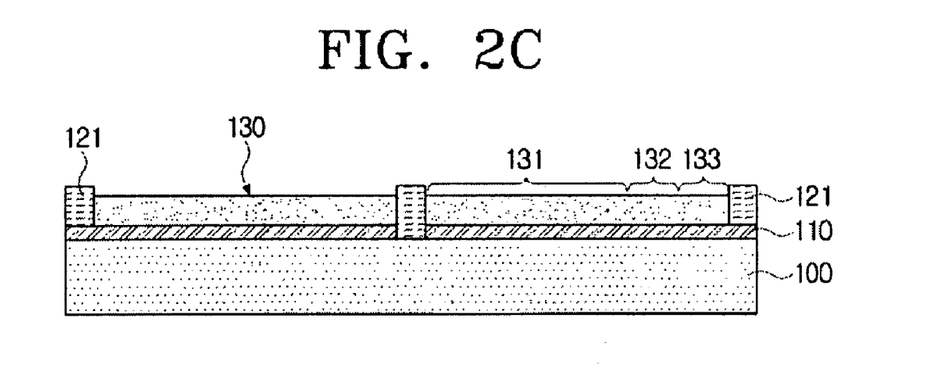
Figure 3C:
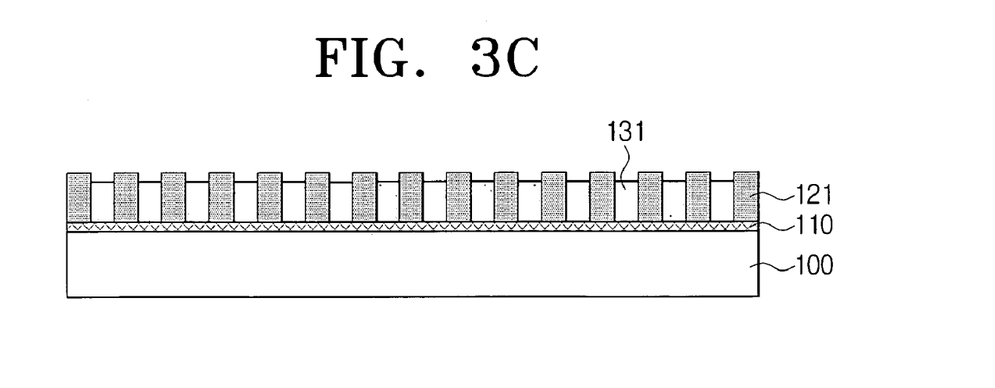
Figure 4A:
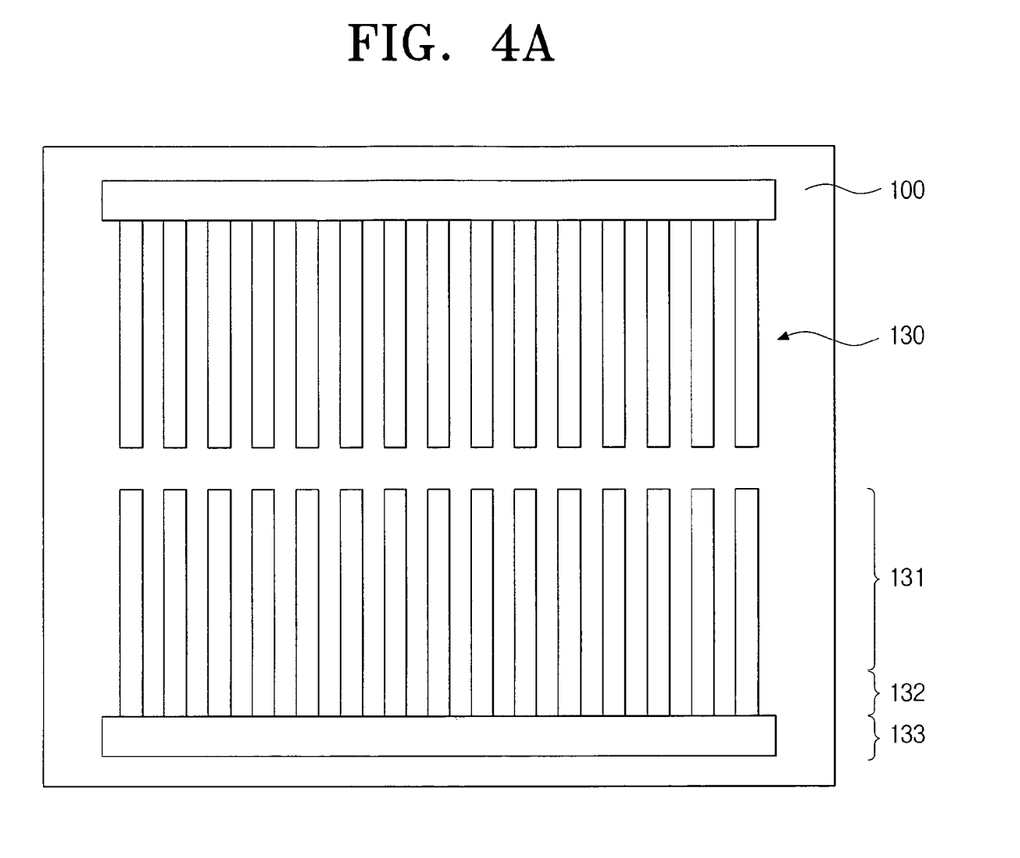
FIG. 4A is a plan view illustrating a metal pattern of FIG. 2D.

As shown in FIGS. 2C and 3C, portions between the first photo-resist membrane patterns 121 are electroplated with a metal material. Preferably, the metal material may be copper (CU). The lower metal patterns 130 include lower coil portions 131, extension metal lines 132 extended by a certain length from the lower coil portions 131, and common metal lines 133 connecting each extension metal line 132 as shown in FIG. 4A. The extension metal lines 132 and the common metal lines 133 are for applying electrical signal to each lower coil portion 131.

Figure 2D:
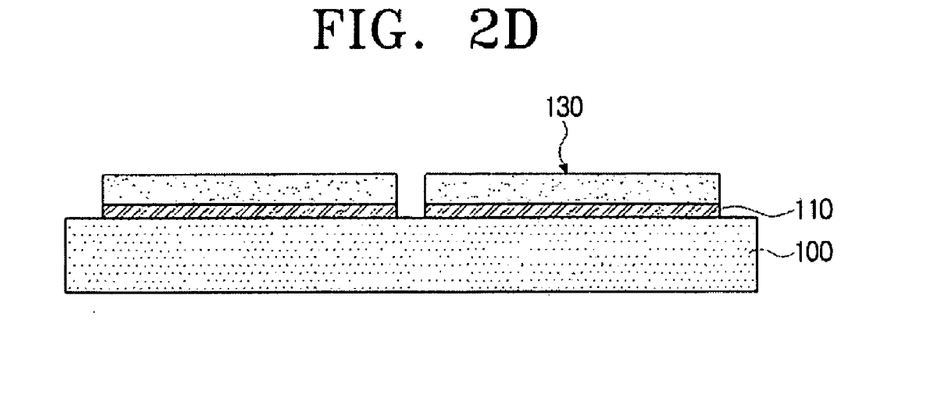
Figure 3D:
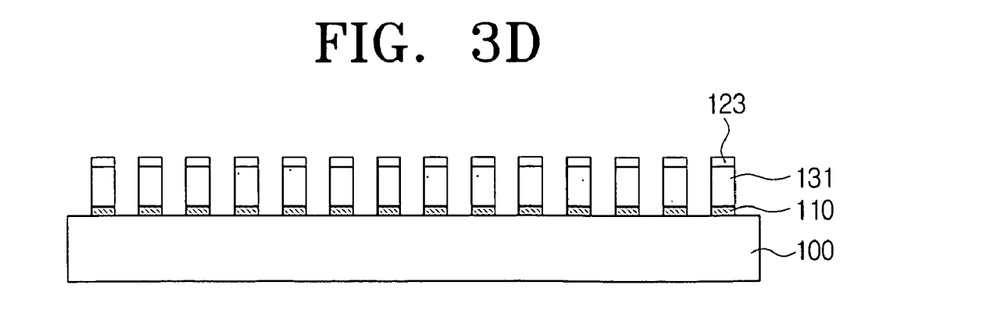

As shown in FIGS. 2D and 3D, the first photo-resist membrane patterns 121 are removed, and the first seed layer 110 is removed according to the mask patterns 123.

Figure 2E:
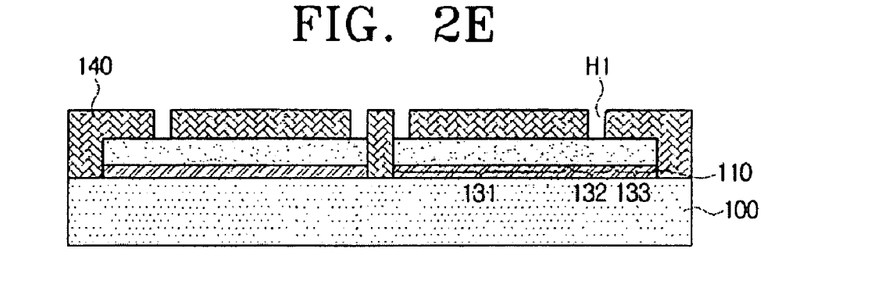
Figure 3E:
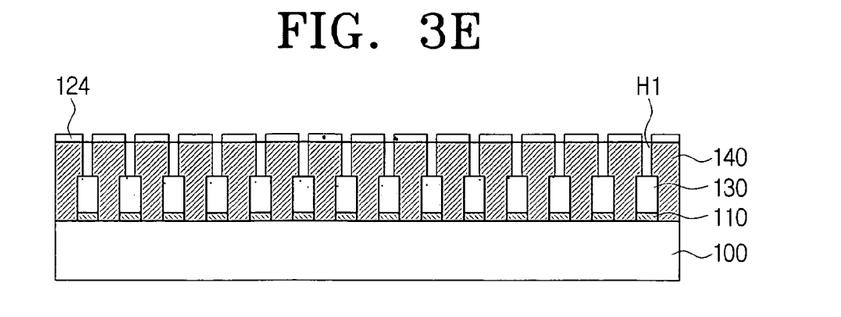

As shown in FIGS. 2E and 3E, a first insulation layer 140 is deposited to cover the metal patterns 130, and a plurality of first viaholes H1 are formed according to the mask pattern 124. The viaholes H1 are formed to open a certain portion of the metal pattern 130, and preferably, to open opposite ends of a portion corresponding to the lower coil portions 131. Here, the first insulation layer 140 isolates the lower coil portions 131 from a magnetic core 160 which will be formed in a later step.

Figure 2F:
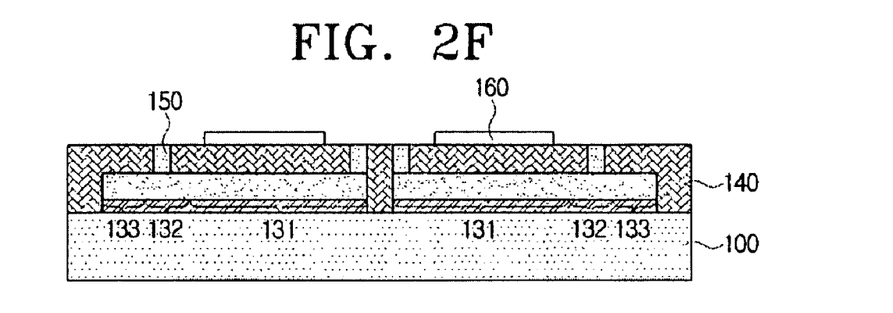
Figure 3F:
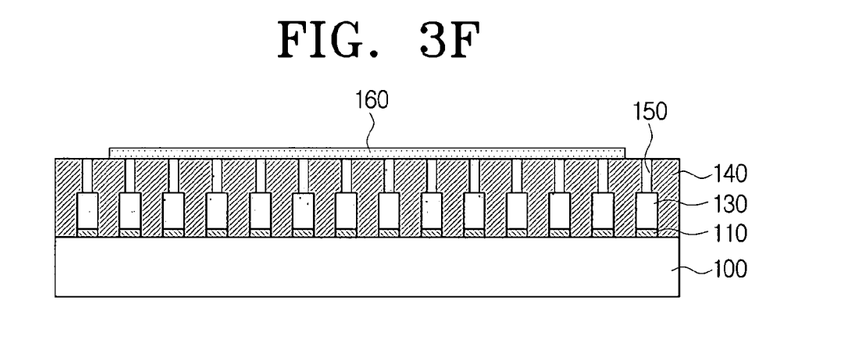

As shown in FIGS. 2F and 3F, the first viaholes H1 are filled with metal material by electroplating to form connection portions 150. Here, the seed layer 110 and the metal pattern 130 are used as the metal line to electroplate the connection portions 150. Accordingly, it is not necessary to form a separate seed layer for electroplating the first viaholes H1, contrary to the conventional art. Because the first viaholes H1 are plated with the metal material by using the first seed layer 110 that applies an electric current to lower portions of the first viaholes H1, the metal material is effectively accumulated from lower ends of the first viaholes H1.

Accordingly, the connection portions 150 can be effectively connected with the lower coil portions 131.

As shown in FIGS. 2F and 3F, upper portions of the first insulation layer 140, i.e., portions corresponding to the lower coil portions 131 are patterned with a magnetic material to form the magnetic core 160. To form the magnetic core 160, a magnetic core material may be deposited on the first insulation layer 140 and mask-patterned.

Figure 2G:
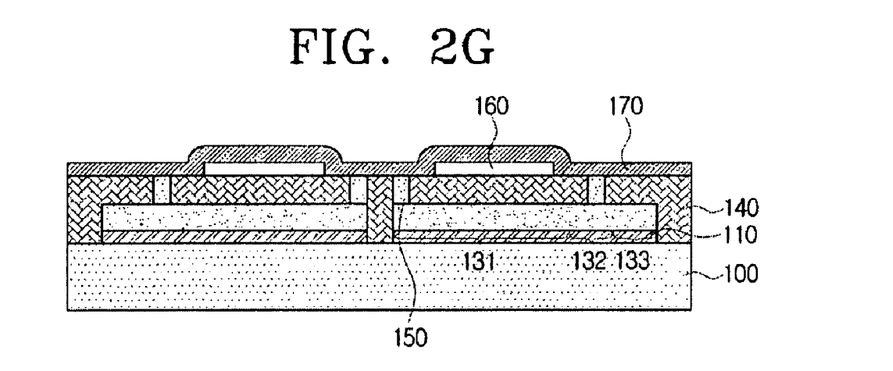
Figure 3G:
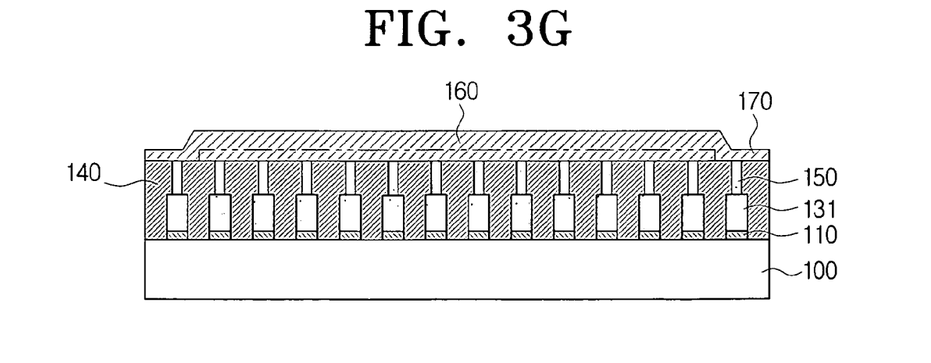

As shown in FIGS. 2G and 3G, a second insulation layer 170 is deposited to cover the magnetic core 160 and the connection portions 150. The second insulation layer 170 electrically isolates the magnetic core 160 from upper coil portions 180 which will be formed in a later step.

Figure 2H:
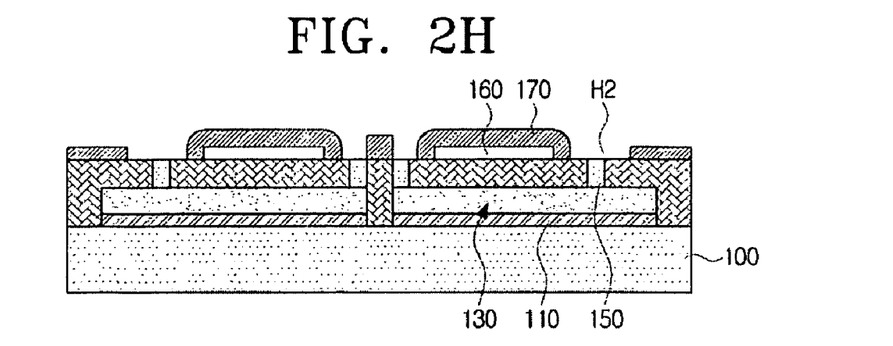
Figure 3H:
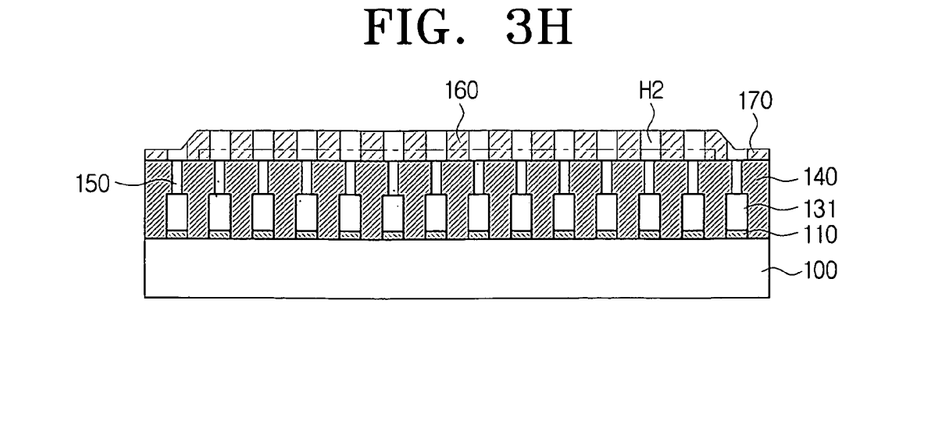

As shown in FIGS. 2H and 3H, the second insulation layer 170 is removed according to a certain pattern to form second viaholes H2. The connection portions 150 are exposed through the second viaholes H2. The second viaholes H2 may be understood as portions from which the second insulation layer 170 is etched away to open the connection portions 150 rather than holes.

Figure 2I:
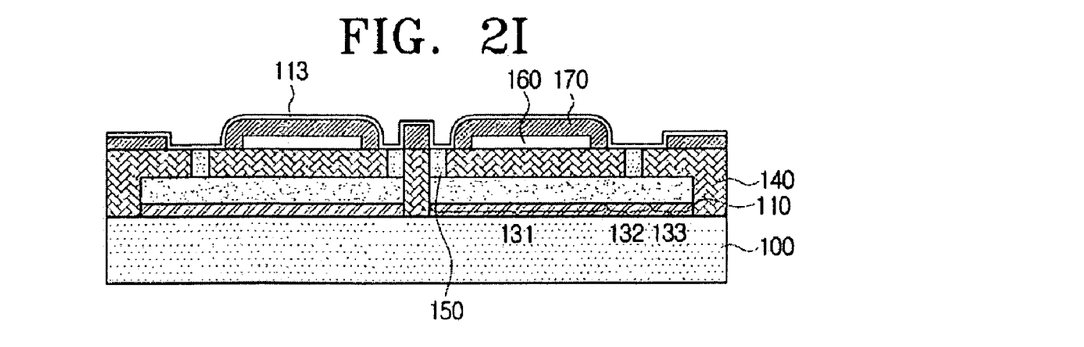

As shown in FIG. 2I, a second seed layer 113 is formed to cover the opened connection portions 150 and the second insulation layer 170.

Figure 2J:
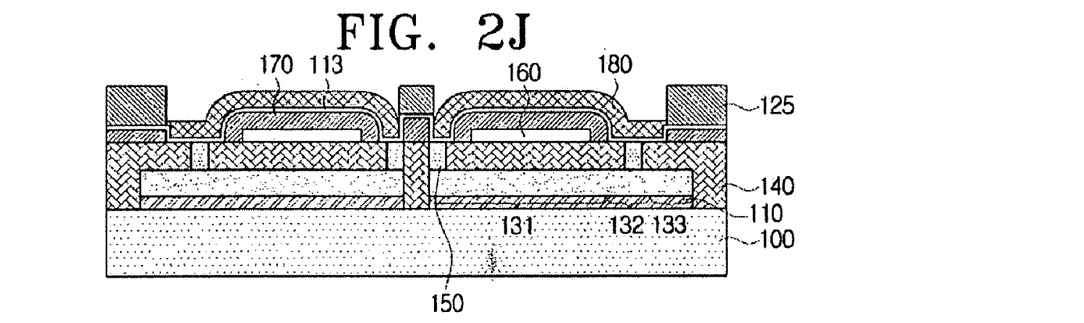
Figure 3I:
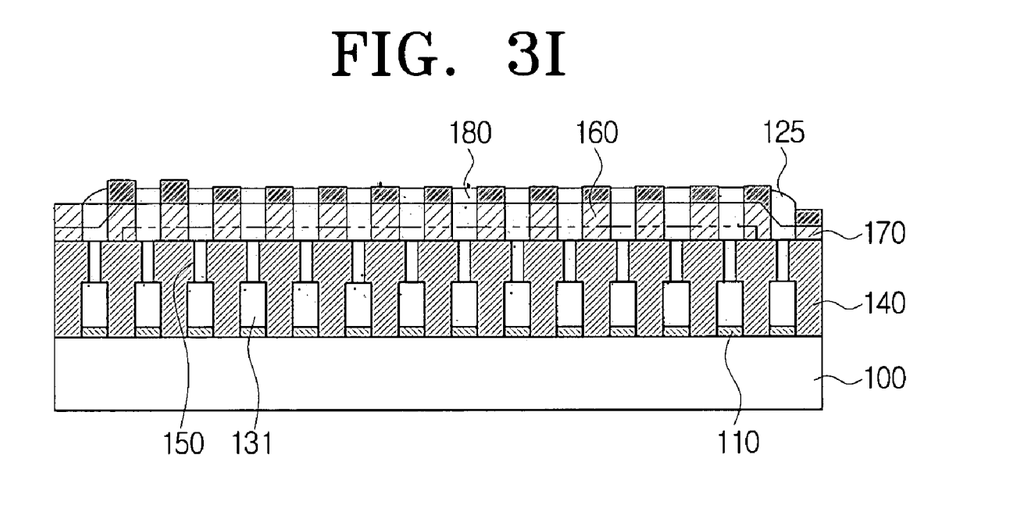

As shown in FIGS. 2J and 3I, second photo-resist membrane patterns 125 are formed. Portions except for the second photo-resist membrane pattern 125 are electroplated and filled with a metal material. Then, the upper coil portions 180 are formed as shown.

Figure 2K:
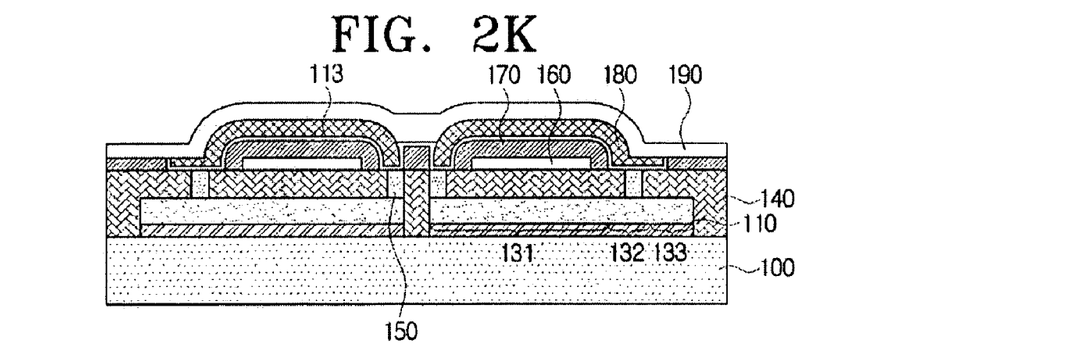
Figure 3J:
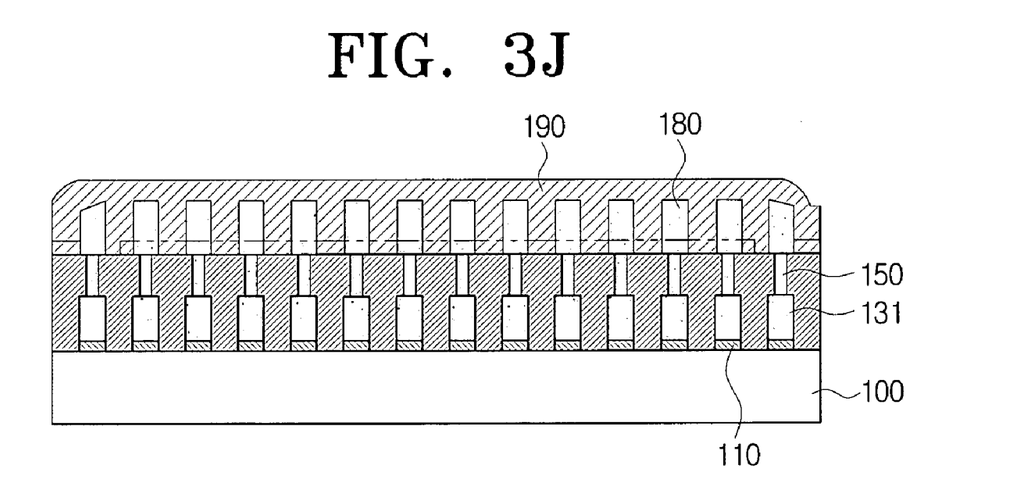

As shown in FIGS. 2K and 3J, the second photo-resist membrane patterns 125 are removed and the second seed layer 113 exposed through the portions from which the second photo-resist membrane patterns 125 are removed, is also removed. Then, a third insulation layer 190 is deposited to cover the upper coil portions 180. The third insulation layer 190 is for protecting and isolating the upper coil portions 180 from the outside.

Figure 2L:
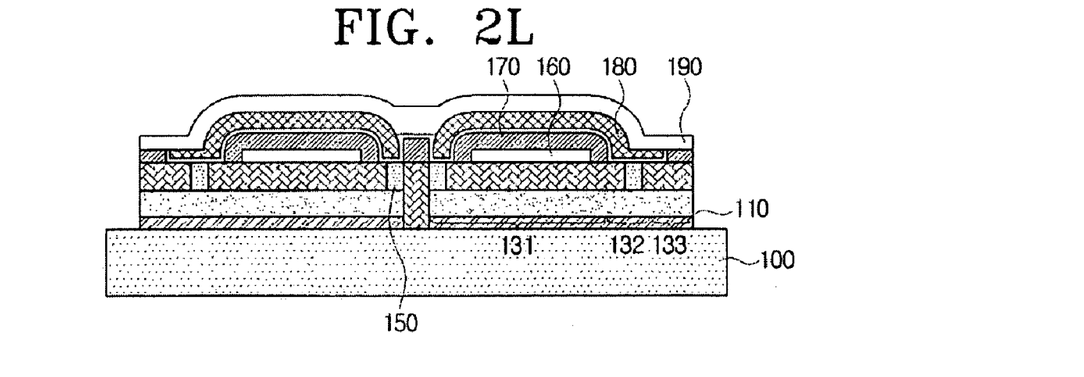
Figure 4B:
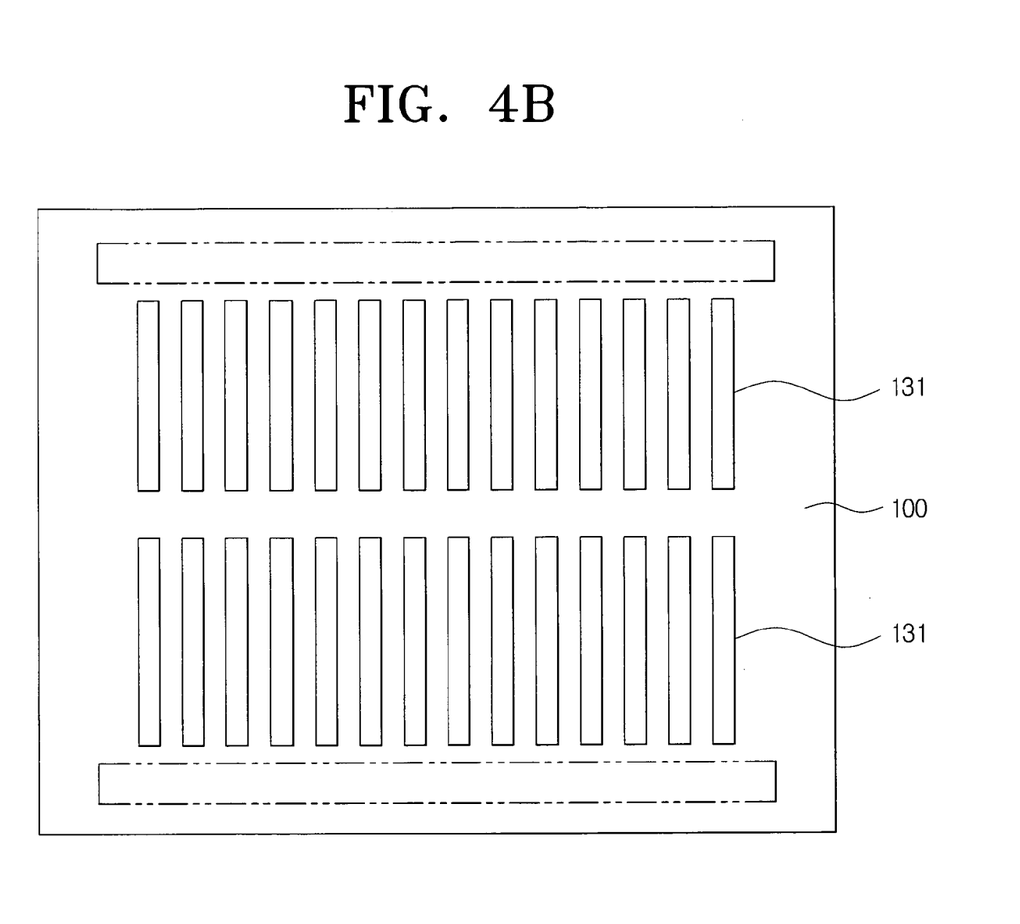
FIG. 4B is a plan view illustrating the metal pattern of FIG. 4A from which a metal extension line is removed.

As shown in FIG. 2L, portions except for the coil portion are removed according to unshown mask patterns so that the lower coil portions 131 can be isolated from the common metal lines 133 in each metal pattern 130. For example, as shown in FIG. 2L or FIG. 4B, the common metal lines 133 and the extension metal lines 132 may both be removed. Then, the lower coil portions 131 and the upper coil portions 180 have an extended coil structure by the connection portions 150 so that the manufacturing of the micro flux gate sensor is completed.

According to the method of manufacturing the micro flux gate sensor of the present invention as described above, when the viaholes are electroplated with a metal material, electric signals are applied from the lower metal patterns. The viaholes connect the lower coil portions and the upper coil portions, which form coils. Accordingly; the viaholes can be effectively filled with the metal material and the electrical characteristic with the lower coil portions can be improved.

In comparison with the conventional art, the process of electroplating the viaholes becomes easier, the completion of the plating process is improved so that the electrical characteristic can be improved, the coil resistance becomes stable, the defect rate can be reduced and the characteristic of sensor can be enhanced.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method of manufacturing a micro flux gate sensor comprising:
    (a) forming a metal pattern including lower coil portions of an excitation coil and a magnetic field detecting coil on a wafer;
    (b) forming a first insulation layer to cover the metal pattern and forming viaholes to expose a certain portion of the metal pattern;
    (c) applying an electrical signal through the metal pattern and plating the viaholes with a metal material to form a connection portion;
    (d) forming a magnetic core on an upper portion of the first insulation layer;
    (e) forming a second insulation layer to cover the magnetic core and forming an upper coil portion electrically connected to the connection portion to form the excitation coil and the magnetic field detecting coil;
    (f) forming a third insulation layer to cover the upper coil portion; and
    (g) removing, a certain portion of the metal pattern to leave at least the lower coil portion of the metal pattern.

2. The method according to claim 1, wherein the operation of (a) comprises:
    cleaning the wafer and forming a seed layer;
    forming first photo-resist membrane patterns on an upper portion of the seed layer;
    electroplating portions between the first photo-resist membrane patterns with a metal material; and
    removing the first photo-resist membrane patterns to leave only the metal material.

3. The method according to claim 2, wherein the metal pattern comprises:
    the lower coil portions arranged in two rows;
    extension metal lines extended from first ends of the lower coil portions; and
    common metal lines connected to first ends of each of the extension metal lines,
    wherein the electrical signal can be applied to each of the lower coil portions through the common metal lines.

4. The method according to claim 3, wherein the operation of (b) comprises:
    etching portions of the seed layer, from which the first photo-resist membrane patterns have been removed;
    forming the first insulation layer on the metal pattern and on portions exposed by removal of the seed layer; and
    forming the viaholes to penetrate the first insulation layer and reach each of opposite ends of the lower coil portions.

5. The method according to claim 3, wherein in the operation of (g), the extension metal line is etched and removed so that the common metal line is isolated from the lower coil portions.

6. The method according to claim 3, wherein in the operation of (g), the extension metal line and the common metal line are both etched and removed.

7. The method according to claim 1, wherein the operation of (e) comprises:
    forming a second insulation layer to cover the magnetic core and the connection portion;
    patterning the second insulation layer to expose the connection portion;
    forming a second seed layer on the second insulation layer including the exposed connection portion;
    forming second photo-resist membrane patterns on the second seed layer; and electroplating portions between the second photo-resist membrane patterns with the metal material to form the upper coil portion.

8. The method according to claim 7, wherein the operation of (f) comprises:
removing the second photo-resist membrane patterns;
removing the second seed layer exposed through the removed portions of the second photo-resist membrane patterns; and
removing the second seed layer and depositing a third insulation layer to cover the upper coil portion.

9. The method according to claim 8, wherein in the operation of (g), portions except for portions corresponding to the lower coil portions and the upper coil portions are etched according to a mask pattern to leave only the lower coil of the metal pattern.

* * * * *